United States Patent
Cheng et al.

(10) Patent No.: US 11,183,636 B2
(45) Date of Patent: Nov. 23, 2021

(54) TECHNIQUES FOR FORMING RRAM CELLS

(71) Applicant: International Business Machines Corporation, Armonk, NY (US)

(72) Inventors: Kangguo Cheng, Schenectady, NY (US); Juntao Li, Cohoes, NY (US); Dexin Kong, Guilderland, NY (US); Takashi Ando, Tuckahoe, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 16/848,603

(22) Filed: Apr. 14, 2020

(65) Prior Publication Data
US 2020/0243767 A1 Jul. 30, 2020

Related U.S. Application Data

(62) Division of application No. 16/138,409, filed on Sep. 21, 2018, now Pat. No. 10,658,590.

(51) Int. Cl.
*H01L 27/24* (2006.01)
*H01L 45/00* (2006.01)

(52) U.S. Cl.
CPC ...... *H01L 45/1675* (2013.01); *H01L 27/2436* (2013.01); *H01L 45/1233* (2013.01);
(Continued)

(58) Field of Classification Search
CPC ............. H01L 45/1675; H01L 45/1233; H01L 45/1253; H01L 45/145; H01L 45/1608; H01L 27/2436
See application file for complete search history.

(56) References Cited

U.S. PATENT DOCUMENTS

| 5,107,459 A | 4/1992 | Chu et al. |
| 6,108,230 A | 8/2000 | Anh et al. |

(Continued)

FOREIGN PATENT DOCUMENTS

WO    WO2016204420 A1    12/2016

OTHER PUBLICATIONS

Akifumi Kawahara et al., "An 8 Mb multi-layered cross-point ReRAM macro with 443 MB/s write throughput," IEEE Journal of Solid-State Circuits, vol. 48, No. 1, Jan. 2013, pp. 178-185.
(Continued)

*Primary Examiner* — Mark W Tornow
(74) *Attorney, Agent, or Firm* — Randall Bluestone; Michael J. Chang, LLC

(57) ABSTRACT

Techniques for forming RRAM cells with increased density are provided. In one aspect, a method of forming a RRAM device includes: providing an underlayer disposed on a substrate; patterning trenches in the underlayer; forming bottom electrodes at two different levels of the underlayer that includes first bottom electrodes at bottoms of the trenches and second bottom electrodes along a top surface of the underlayer in between the trenches; depositing an insulating layer on the first/second bottom electrodes; and forming top electrodes on the insulating layer, wherein the top electrodes include word lines, wherein the first and second bottom electrodes include bit lines that are orthogonal to the word lines. A RRAM device is also provided.

20 Claims, 14 Drawing Sheets

(52) U.S. Cl.
CPC ........ *H01L 45/1253* (2013.01); *H01L 45/145* (2013.01); *H01L 45/1608* (2013.01)

(56) References Cited

U.S. PATENT DOCUMENTS

| | | |
|---|---|---|
| 6,429,529 B1 | 8/2002 | Keeth |
| 8,835,256 B1 * | 9/2014 | DeBrosse ......... H01L 29/66787 |
| | | 438/268 |
| 9,059,391 B2 | 6/2015 | Hou et al. |
| 9,171,584 B2 | 10/2015 | Scheuerlein et al. |
| 9,431,608 B2 | 8/2016 | Perniola et al. |
| 9,735,201 B2 | 8/2017 | Seki et al. |
| 2008/0203469 A1 * | 8/2008 | Gruening-von Schwerin ............. |
| | | G11C 13/0007 |
| | | 257/327 |
| 2008/0247225 A1 * | 10/2008 | Liu ......... H01L 45/16 |
| | | 365/163 |
| 2012/0286227 A1 * | 11/2012 | Chung ........ H01L 27/228 |
| | | 257/4 |
| 2014/0312296 A1 * | 10/2014 | Jo ......... H01L 45/146 |
| | | 257/4 |
| 2015/0029775 A1 * | 1/2015 | Ravasio ........ H01L 45/06 |
| | | 365/63 |
| 2017/0316824 A1 | 11/2017 | Bedau |

OTHER PUBLICATIONS

List of IBM Patents or Applications Treated as Related (2 pages).

* cited by examiner

TECHNIQUES FOR FORMING RRAM CELLS

CROSS-REFERENCE TO RELATED APPLICATIONS

This application is a divisional of U.S. application Ser. No. 16/138,409 filed on Sep. 21, 2018, the contents of which are incorporated by reference herein.

FIELD OF THE INVENTION

The present invention relates to resistive random access memory (RRAM), and more particularly, to techniques for forming RRAM cells with increased density (~2x) within the same footprint area.

BACKGROUND OF THE INVENTION

Resistive random access memory (RRAM) is an emerging non-volatile (NV) random-access memory (RAM). RRAM has the potential for both classic memory applications and neuromorphic computing.

In a RRAM, a memristor element (e.g., HfOx) is sandwiched between two electrodes. Defects (e.g., oxygen vacancies) are intentionally introduced in the memristor film which can be programmed to different logic states such as a low-resistance state (logic "1") or a high-resistance state (logic "0") by changing the polarity of electrical field across the memristor element.

In terms of RRAM cell area scaling however, it is difficult to control the formation of RRAM cells in a small area. Further, the RRAM cell density is limited in the available area inside the chip.

Therefore, a new integration approach is needed to increase the density of RRAM arrays.

SUMMARY OF THE INVENTION

The present invention provides techniques for forming resistive random access memory (RRAM) cells with increased density. In one aspect of the invention, a method of forming a RRAM device is provided. The method includes: providing an underlayer disposed on a substrate; patterning trenches in the underlayer; forming bottom electrodes at two different levels of the underlayer whereby the bottom electrodes include first bottom electrodes at bottoms of the trenches and second bottom electrodes along a top surface of the underlayer in between the trenches; depositing an insulating layer on the first and second bottom electrodes; and forming top electrodes on the insulating layer over the first and second bottom electrodes, wherein the top electrodes include word lines, wherein the first and second bottom electrodes include bit lines that are orthogonal to the word lines, and wherein the first and second bottom electrodes, the insulating layer, and the top electrodes form the RRAM device having an array of cells, each cell having one of the first or second bottom electrodes separated from one of the top electrodes by the insulating layer.

In another aspect of the invention, another method of forming a RRAM device is provided. The method includes: providing an underlayer disposed on a substrate; patterning trenches in the underlayer; forming bottom electrodes at two different levels of the underlayer whereby the bottom electrodes include first bottom electrodes at bottoms of the trenches and second bottom electrodes along a top surface of the underlayer in between the trenches; depositing an insulating layer on the first and second bottom electrodes; forming top electrodes on the insulating layer over the first and second bottom electrodes, wherein the top electrodes include word lines, wherein the first and second bottom electrodes include bit lines that are orthogonal to the word lines, and wherein the first and second bottom electrodes, the insulating layer, and the top electrodes form the RRAM device having an array of cells, each cell having one of the first or second bottom electrodes separated from one of the top electrodes by the insulating layer; and forming contacts to the first and second bottom electrodes, wherein the contacts to the first bottom electrodes are formed at a first end of the array, and wherein the contacts to the second bottom electrodes are formed at a second end of the array that is opposite to the first end of the array.

In yet another aspect of the invention, a RRAM device is provided. The RRAM device includes: a substrate; an underlayer disposed on the substrate; trenches patterned in the underlayer; bottom electrodes disposed at two different levels of the underlayer whereby the bottom electrodes include first bottom electrodes at bottoms of the trenches and second bottom electrodes along a top surface of the underlayer in between the trenches; an insulating layer disposed on the first and second bottom electrodes; and top electrodes disposed on the insulating layer over the first and second bottom electrodes, wherein the top electrodes include word lines, wherein the first and second bottom electrodes include bit lines that are orthogonal to the word lines, and wherein the first and second bottom electrodes, the insulating layer, and the top electrodes form the RRAM device having an array of cells, each cell having one of the first or second bottom electrodes separated from one of the top electrodes by the insulating layer.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming resistive random access memory (RRAM) cells with increased density (~2×) without increasing the footprint area of the cells. An exemplary methodology for forming an RRAM device is now described by way of reference to FIGS. 1-20.

Figure 1:
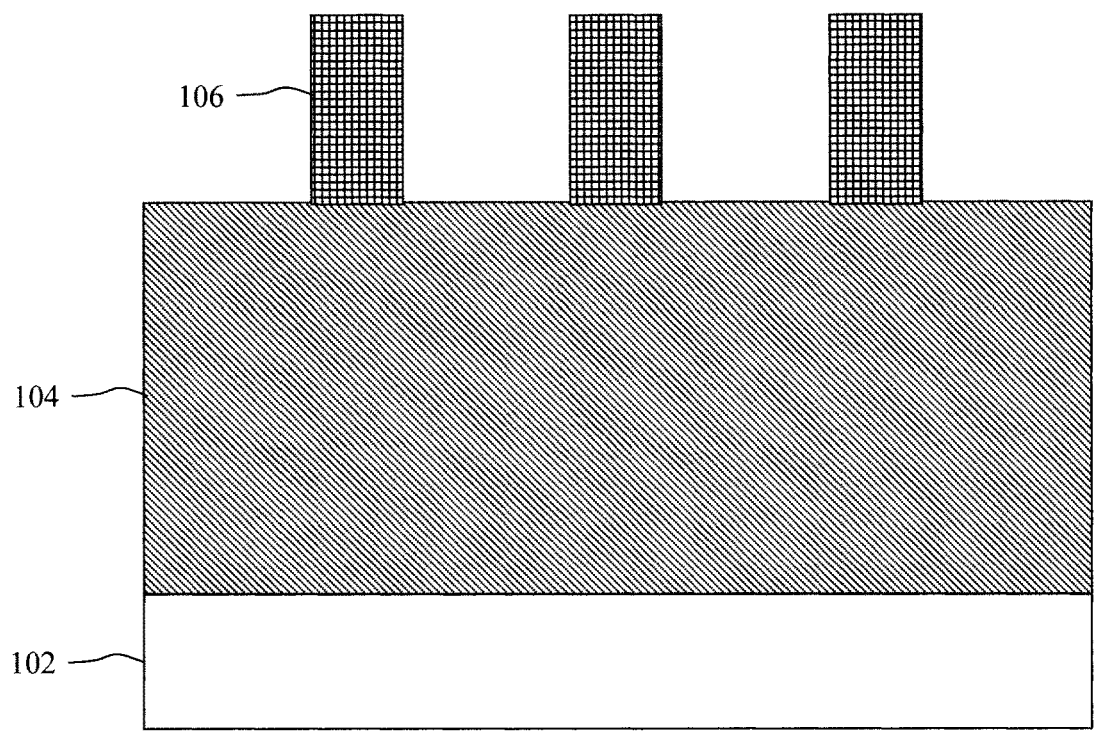
FIG. 1 is a cross-sectional diagram illustrating an underlayer disposed on a substrate, and a patterned hardmask having been formed on the underlayer according to an embodiment of the present invention.

As shown in FIG. 1, the process begins with a bulk semiconductor substrate 102, such as a bulk silicon (Si) or germanium (Ge) wafer, on which an underlayer 104 is disposed. The substrate 102 can also include other semiconductor materials, such as strained silicon, silicon carbide (SiC), silicon germanium (SiGe), silicon-germanium-carbon (SiGeC), a silicon alloy, a germanium alloy, gallium arsenide (GaAs), indium arsenide (InAs), indium phosphide (InP), cadmium arsenide, cadmium selenide, or a combination including at least one of the foregoing. While not explicitly shown, the underlayer 104 can include electronic components such as transistors and associated wiring. Suitable materials for the underlayer 104 include, but are not limited to, interlayer dielectrics (ILD) such as silicon oxide (SiOx) and ultra-low κ dielectrics such as porous organosilicate glass (pSiCOH). By way of example only, ultra-low κ dielectrics have a dielectric constant κ of less than 2.7. By comparison, silicon dioxide ($SiO_2$) has a dielectric constant κ value of 3.9.

Figure 2:
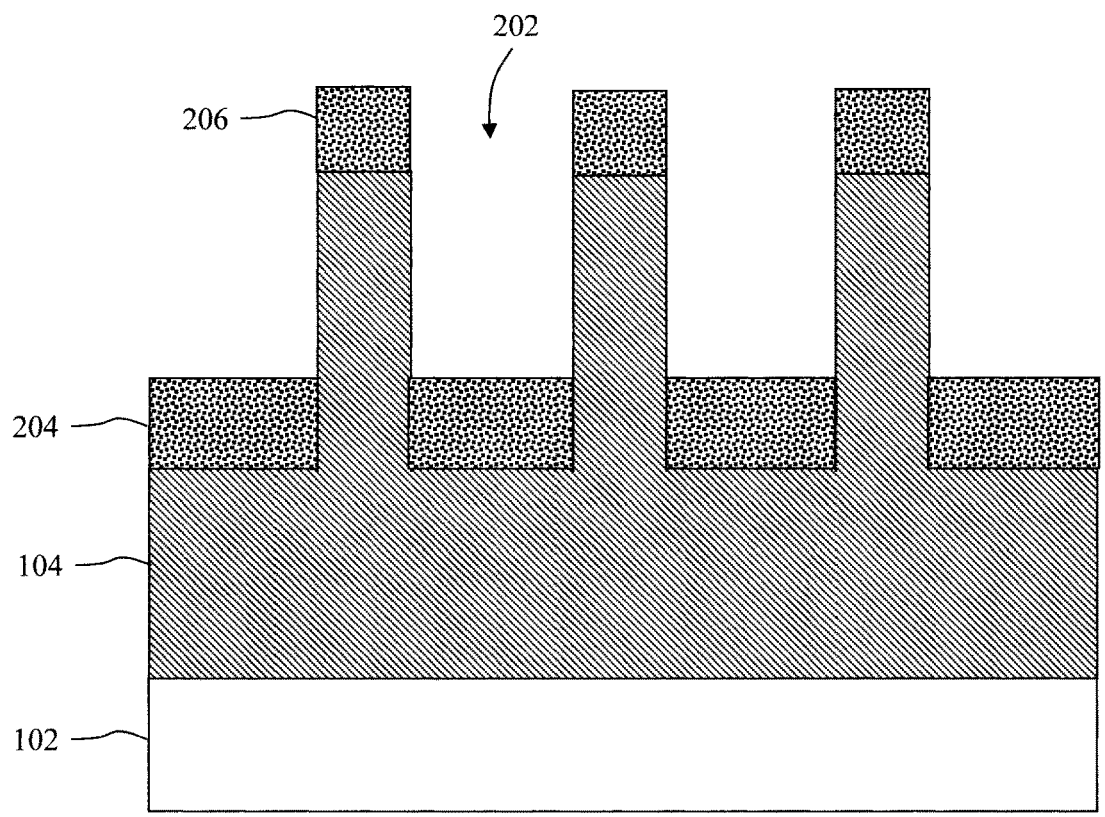
FIG. 2 is a cross-sectional diagram illustrating the hardmask having been used to pattern trenches in the underlayer, the hardmask having been removed, and lower level and higher level bottom electrodes having been formed on the horizontal surfaces of the underlayer present i) at the bottoms of the trenches and ii) along the top surface of the underlayer in between the trenches according to an embodiment of the present invention.

Lithography and etching techniques are then used to pattern a hardmask 106 on the underlayer 104. Suitable hardmask materials include, but are not limited to, nitride hardmask materials such as silicon nitride (SiN) and/or silicon oxycarbonitride (SiOCN). Hardmask 106 is used to pattern trenches 202 in the underlayer 104. See FIG. 2. As shown in FIG. 2, the trenches 202 extend partway through the underlayer 104. A directional (anisotropic) etching process such as reactive ion etching (RIE) can be employed for patterning the trenches 202.

Following patterning of the trenches 202, the hardmask 106 is removed. Lower level and higher level bottom electrodes 204 and 206 are then formed on the horizontal surfaces of the underlayer 104 present i) at the bottoms of the trenches 202 and ii) along the top surface of the underlayer 104 in between the trenches 202, respectively. See FIG. 2. Suitable electrode materials for the lower level and higher level bottom electrodes 204 and 206 include, but are not limited to, metals such as titanium (Ti), and/or tungsten (W), metal nitrides such as titanium nitride (TiN), tantalum nitride (TaN), titanium aluminum nitride (TiAlN), and/or tungsten nitride (WN), a metal-semiconductor compound (for example, a metal silicide), and combinations thereof. By way of example only, suitable metal silicides include, but are not limited to, nickel silicide ($Ni_2Si$), cobalt silicide (CoSi), tungsten silicide ($WSi_2$), titanium silicide ($TiSi_2$), tantalum silicide ($TaSi_2$), platinum silicide (PtSi), erbium silicide ($ErSi_2$), and combinations thereof. For clarity, the terms "first" and "second" may also be used herein to refer to the lower level and higher level bottom electrodes 204 and 206, respectively.

According to an exemplary embodiment, the lower level and higher level bottom electrodes 204 and 206 are formed using a non-conformal directional deposition process whereby the electrode material is deposited with a greater amount of the material being deposited on horizontal surfaces (including at the bottoms of the trenches 202 and along the top surface of the underlayer 104 in between the trenches 202), as compared to vertical surfaces (such as along sidewalls of the trenches 202). Thus, when an etch is used on the electrode material, the timing of the etch needed to remove the electrode material from the vertical surfaces will leave the lower level and higher level bottom electrodes 204 and 206 shown in FIG. 2 since a greater amount of the material was deposited on these horizontal surfaces. By way of example only, a high density plasma (HDP) chemical vapor deposition (CVD) or physical vapor deposition (PVD) process can be used for directional film deposition, and a metal-selective non-directional (isotropic) etch can be used to remove the (thinner) electrode material deposited onto the vertical surfaces.

As will be described in detail below, offsetting the bottom electrodes 204 and 206 at different (lower/higher) levels enables the formation of additional RRAM cells without increasing the overall footprint of the device. Further, contacts to the bottom electrodes 204 and 206 will be formed through dielectric, thereby avoiding concerns of misalignment and shorting of the electrodes/contacts. Namely, as will be described in detail below, the contacts to the bottom electrodes 204 and 206 will be formed apart from each other and located at opposite ends of the array. They are insulated by the surrounding dielectric material.

Figure 3:
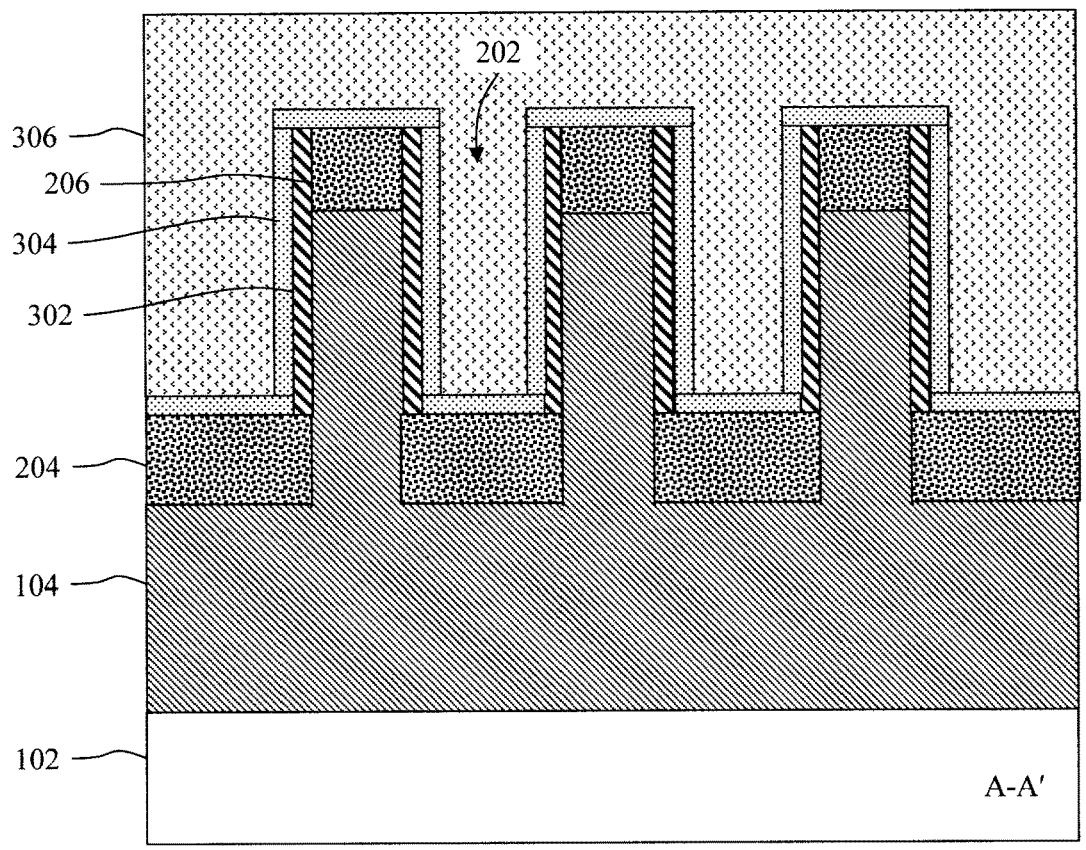
FIG. 3 is a cross-sectional diagram through one top electrode illustrating sidewalls of the trenches having been lined with sidewall spacers, an insulating layer having been disposed on the bottom electrodes, and the top electrodes having been formed on the insulating layer over the bottom electrodes according to an embodiment of the present invention.
Figure 4:
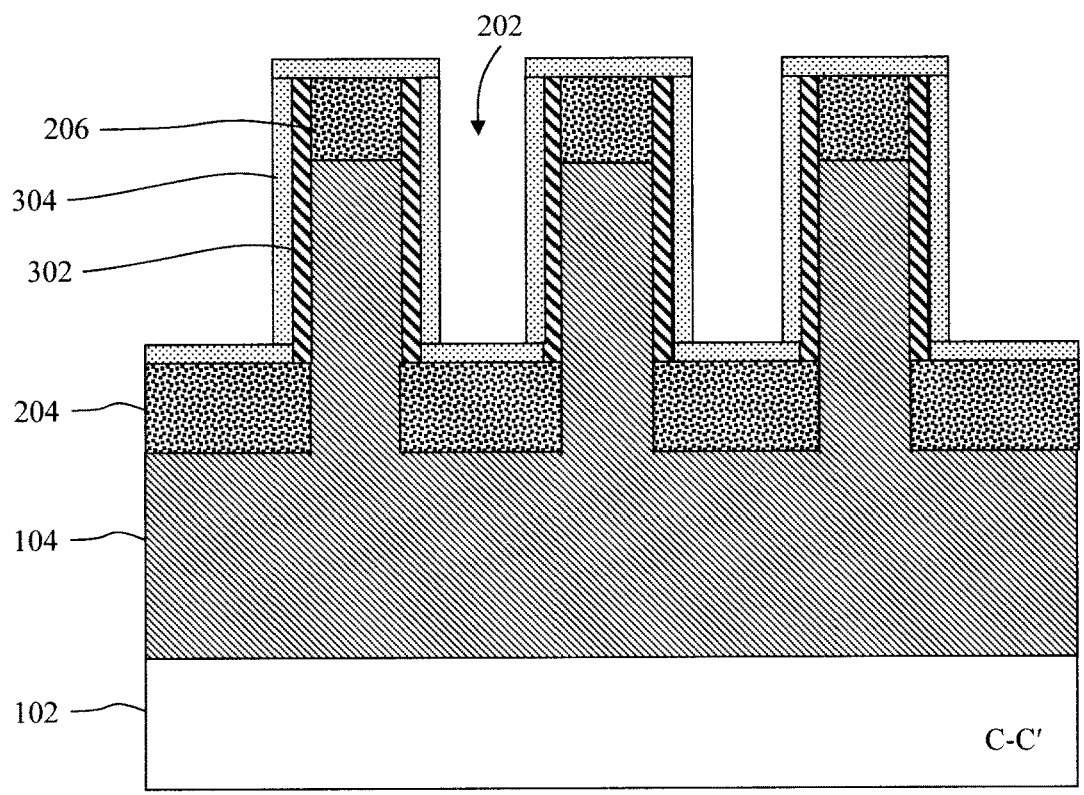
FIG. 4 is a cross-sectional diagram through the bottom electrodes in between the top electrodes illustrating sidewalls of the trenches having been lined with the sidewall spacers and the insulating layer having been disposed on the bottom electrodes according to an embodiment of the present invention.

Each RRAM cell formed will include an (electrically) insulating layer between a top electrode (see below) and one of the bottom electrodes 204 and 206. To do so, the sidewalls of the trenches 202 are preferably first lined with sidewall spacers 302. See FIG. 3 and FIG. 4. FIG. 3 provides a cross-sectional view through one of the patterned top electrodes (see below) and FIG. 4 provides a cross-sectional view through the bottom electrodes 204 and 206 in between the patterned top electrodes. An orientation of these cross-sectional views can be found, for example, in the top-down view shown in FIG. 6, described below.

While optional, the sidewall spacers 302 avoid direct contact between the insulating layer (see below) and the underlayer 104, and thus protect the underlayer 104 during the process. According to an exemplary embodiment, the sidewall spacers 302 are formed by (conformally depositing a spacer material on the top surface of the underlayer and into and lining the trenches 202, and then using a directional (anisotropic) such as RIE to remove the spacer material from the horizontal surfaces (i.e., the top surface of the underlayer and bottom of the trenches 202), forming the sidewall spacers 302 shown in FIG. 3. Suitable spacer materials include, but are not limited to, nitride spacer materials such as SiN and/or SiOCN. Conformal deposition processes include, but are not limited to, chemical vapor deposition (CVD), atomic layer deposition (ALD), and physical vapor deposition (PVD). According to an exemplary embodiment, the sidewall spacers 302 are formed having a thickness of from about 5 nanometers (nm) to about 20 nm and ranges therebetween.

An (electrically) insulating layer 304 is then (conformally) deposited on the top surface of the underlayer and into and lining the trenches 202 (e.g., over the sidewall spacers 302) such that the insulating layer 304 is disposed on the bottom electrodes 204 and 206. According to an exemplary embodiment, the insulating layer 304 is a high-κ dielectric or transition metal oxide such as nickel oxide ($NiO_x$), tantalum oxide ($Ta_yO_x$), titanium oxide ($TiO_x$), $HfO_x$, tungsten oxide ($WO_x$), zirconium oxide ($ZrO_x$), aluminum oxide ($Al_yO_x$), strontium titanate ($SrTiO_x$), and combinations thereof. Conformal deposition processes include, but are not limited to, CVD, ALD, and PVD. According to an exemplary embodiment, the insulating layer 304 has a thickness of from about 1 nm to 15 nm and ranges therebetween, for example, from about 3 nm to about 9 nm and ranges therebetween, e.g., from about 4 nm to about 7 nm and ranges therebetween.

Referring to FIG. 3, top electrodes 306 are next formed on the insulating layer 304, over the (lower/higher level) bottom electrodes 204 and 206 (i.e., the insulating layer 304 separates the top electrodes 306 from both the bottom electrodes 204 and 206). As shown in FIG. 3, the top electrodes 306 fill the trenches 202 over the lower level bottom electrodes 204 and are present over the higher level bottom electrodes 206 along the top surface of the underlayer 104 in between the trenches 202. To form the top electrodes 306 an electrode material(s) is deposited onto the insulating layer 304, overfilling the trenches 202. A polishing process such as chemical mechanical polishing (CMP) is then used to planarize the electrode material. According to an exemplary embodiment, the top electrodes 306 include a stack of thin (electrically) conductive layers and thick metal layer. The stack of conductive layers can include a stack structure of metal nitrides such as TiN, TaN, and/or WN, Al-containing alloys such as titanium aluminide (TiAl), titanium aluminum carbide (TiAlC), tantalum aluminide (TaAl), and/or tantalum aluminum carbide (TaAlC), metals such as Ti and/or Ta, and combinations thereof. For example, by way of non-limiting example, the top electrodes 306 can include a stack structure of TiN and TiAlC. The metal layer can include Ti, Ta, tungsten (W), molybdenum (Mo), platinum (Pt), hafnium (Hf), copper (Cu), aluminum (Al), gold (Au), nickel (Ni), iridium (Ir), and combinations thereof. The electrode material(s) for top electrodes 306 can be deposited using a process such as CVD, ALD, PVD, sputtering, evaporation, and electrochemical plating.

A lithography and etching process is then employed to pattern the deposited electrode material for top electrodes 306 into strips. A directional (anisotropic) etching process such as RIE can be used for the top electrode patterning. These top electrode strips form wordlines that are orthogonal to bitlines formed by the bottom electrodes 204 and 206. Namely, referring briefly to FIG. 6, each top electrode 306 strip forms a wordline (WL) and each bottom electrode 204 (not visible from the top-down view in FIG. 6) or 206 forms a bitline (BL) that is orthogonal to one of the WLs. Advantageously, the placement of lower and higher level bottom electrodes 204 and 206 provides two sets of BLs, effectively doubling the number of RRAM cells without increasing the device area. Each RRAM cell includes the insulating layer 304 in between a WL and a BL.

Figure 6:
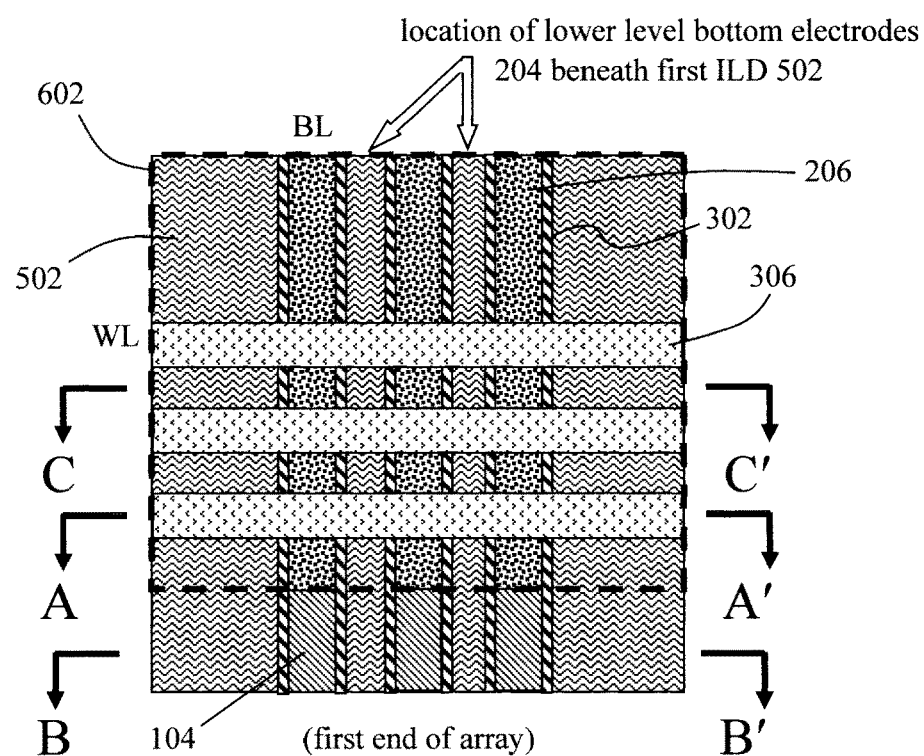
FIG. 6 is a top-down diagram illustrating a block mask having been formed covering all but a first end of the array, and the exposed higher level bottom electrodes having been removed from the first end of the array according to an embodiment of the present invention.

Referring back to FIG. 4, a cross-sectional view of the device through the bottom electrodes 204 and 206 is provided (see view C-C' in FIG. 6). This view is between the patterned top electrodes 306. Thus, the top electrodes 306 are not visible in FIG. 4.

Contacts are next formed to the BLs and WLs. With the present RRAM cell array design, it is a non-trivial process to form contacts to the lower and higher level bottom electrodes 204 and 206 since they are next to each other with ½ of the minimal pitch. The minimal pitch is about 2× of the minimal feature size that lithography techniques can print. Namely, directly forming contacts to the lower and higher level bottom electrodes 204 and 206 is not feasible as it is below the minimal pitch and thus would cause shorts. To solve this problem, two sets of contacts are formed. One set of the contacts is formed at one end of the array to contact the lower level bottom electrodes 204, and the other set is formed at the opposite end of array to contact the higher level bottom electrodes 206. In this manner, each set of BL contacts can be formed at the minimal pitch in a self-aligned manner (see below).

Figure 5:
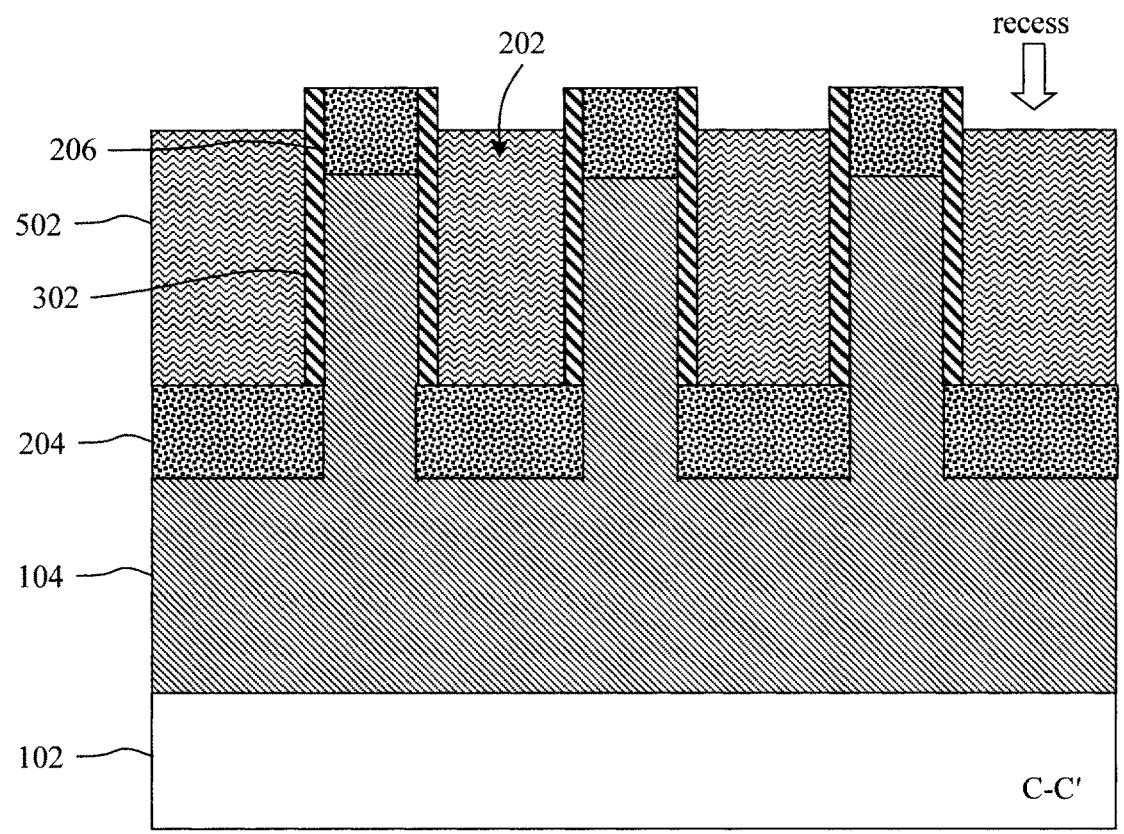
FIG. 5 is a cross-sectional diagram through the bottom electrodes in between the top electrodes illustrating the exposed insulating layer (optionally) having been removed, a first interlayer dielectric (ILD) having been deposited into and filling the trenches, and the first ILD having been recessed below the top surfaces of the higher level bottom electrodes according to an embodiment of the present invention.

Referring to FIG. 5, a cross-sectional view of the device through the bottom electrodes 204 and 206, between the patterned top electrodes 306, is provided (see view C-C' in FIG. 6). As shown in FIG. 5, the exposed insulating layer 304 is removed. The insulating layer 304 is exposed between the patterned top electrodes 306. Thus, the insulating layer 304 covered by the patterned top electrodes 306 (see, e.g., FIG. 3) remains intact. It is notable that removal of the exposed insulating layer 304 is optional since the trenches 202 will be filled with a (first) interlayer dielectric (ILD) (see below) which would simply cover over the insulating layer 304 if not removed.

A first ILD 502 is then deposited into and filling the trenches 202 followed by CMP. Suitable ILDs include, but are not limited to, SiO$_X$, silicon oxycarbide (SiOC) and/or organic planarizing layer (OPL) materials. As shown in FIG. 5, the first ILD 502 is then recessed below the top surfaces of the higher level bottom electrodes 206. As a result, the higher level bottom electrodes 206 are now exposed. A directional (anisotropic) etching process such as RIE can be employed for the recess etch.

FIG. 6 is a top-down view of the array of RRAM cells. As shown in FIG. 6, the array includes a plurality of WLs (formed from top electrode 306 strips) oriented orthogonal to a plurality of BLs (formed from bottom electrodes 204 or 206) forms a bitline (BL). As noted above, the lower level bottom electrodes 204 are not visible from the top-down view in FIG. 6 since they are beneath the first ILD 502. However, arrows are provided to indicate the location of the lower level bottom electrodes 204 beneath the first ILD 502 which is in between the higher level bottom electrodes 206. Sidewall spacers 302 are present alongside the higher level bottom electrodes 206.

The first ILD 502 is then removed from one (first) end of the array to expose the lower level bottom electrodes 204 at that first end of the array. To do so, a standard block mask 602 is formed covering all but that first end of the array. See FIG. 6.

Next, as shown in FIG. 6, an etch is performed to remove the exposed higher level bottom electrodes 206. The exposed higher level bottom electrodes 206 are those portions of the bottom electrodes 206 at the first end of the array not covered by the block mask. A directional (anisotropic) etching process such as RIE can be employed to remove the exposed higher level bottom electrodes 206. As shown in FIG. 6, the underlying underlayer 104 is now visible from the top-down view in between the sidewall spacers 302 at the first end of the array.

Figure 7:
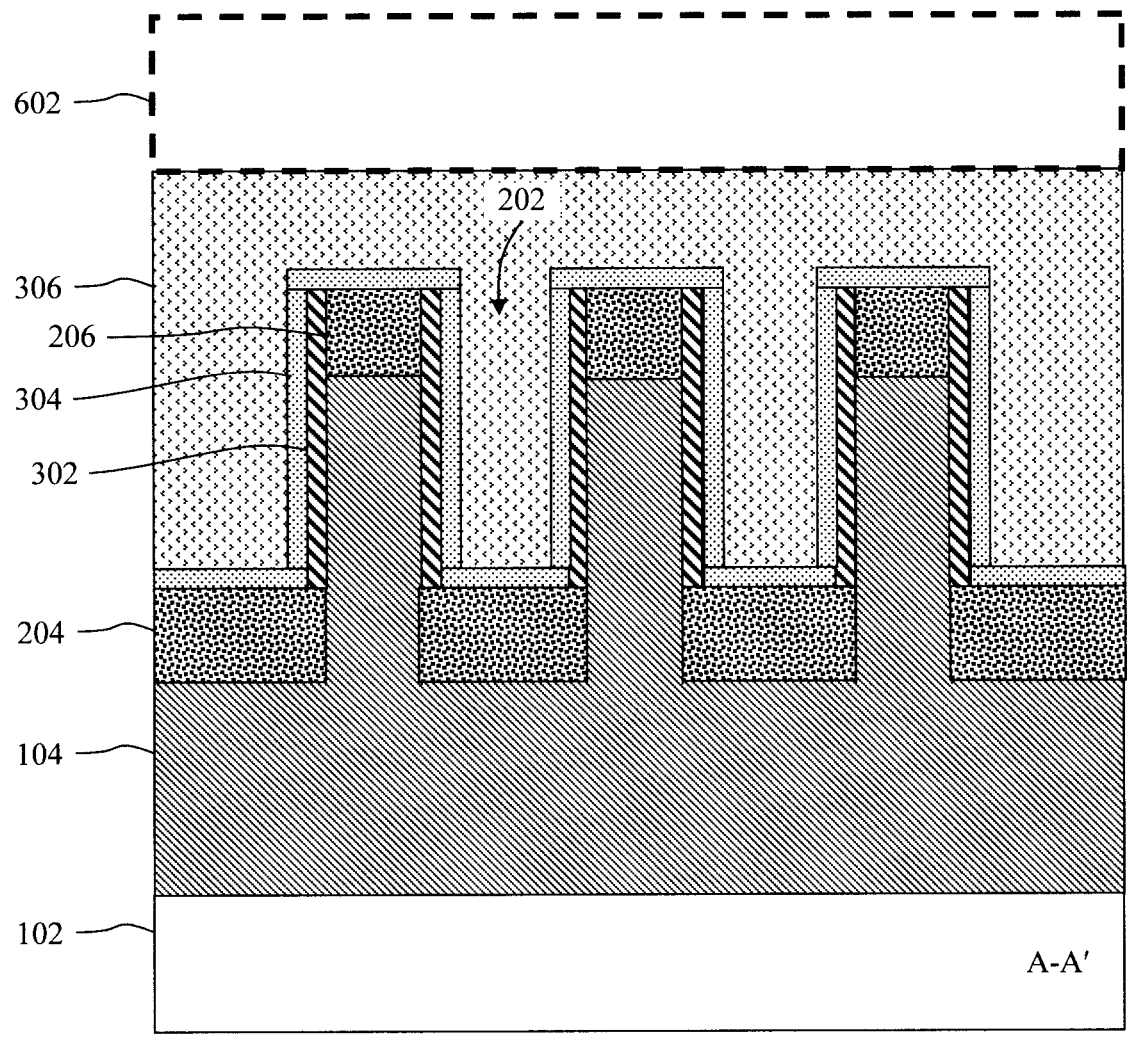
FIG. 7 is a cross-sectional diagram through one of the top electrodes illustrating how the top electrodes are covered/protected by the block mask according to an embodiment of the present invention.

Referring to FIG. 7, a cross-sectional view of the device through one of the patterned top electrodes 306 is provided (see view A-A' in FIG. 6). As shown in FIG. 7, the patterned top electrodes 306 are covered/protected by the block mask 602, and thus are unaffected during the etch of the bottom electrodes 206. As provided above, only the portions of the bottom electrodes 206 at the first end of the array (those portions not covered by the block mask) are removed.

Figure 8:
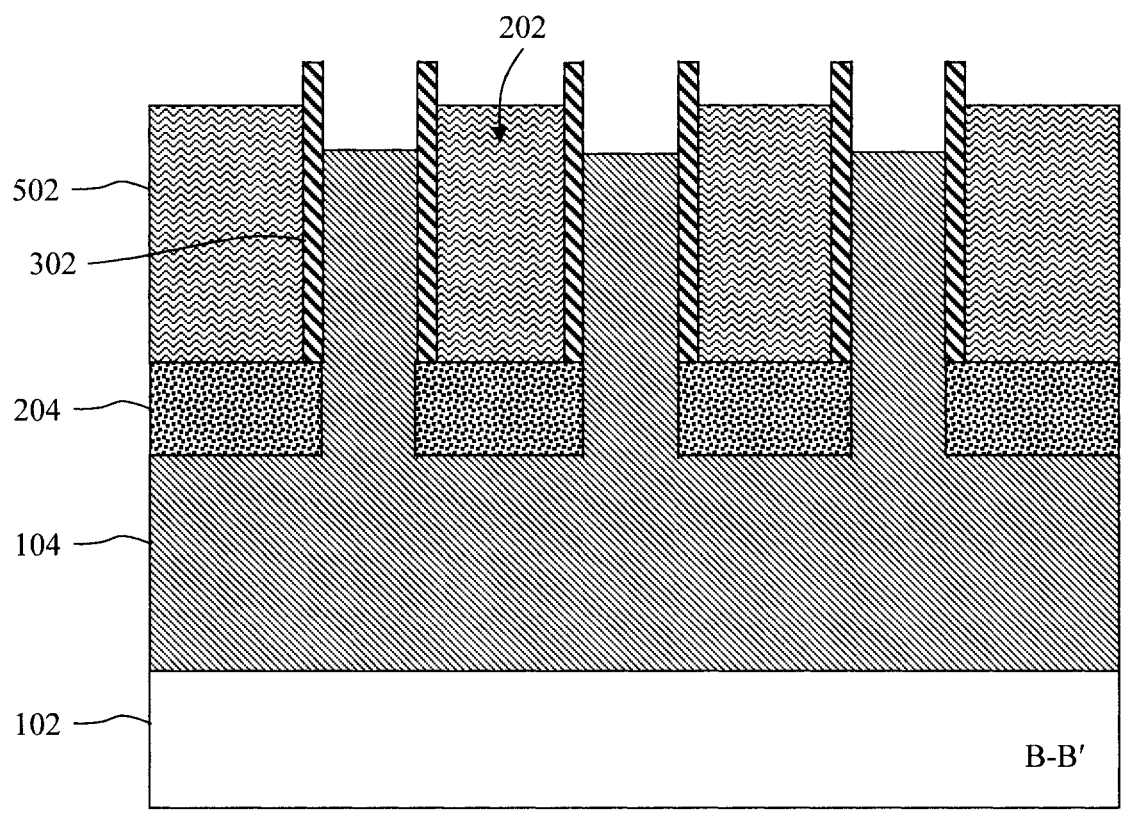
FIG. 8 is a cross-sectional diagram through the first end of the array illustrating the higher level bottom electrodes having been removed from the first end of the array according to an embodiment of the present invention.

Referring to FIG. 8, a cross-sectional view of the device through the first end of the array, is provided (see view B-B' in FIG. 6). As shown in FIG. 8, the higher level bottom electrodes 206 have been removed from the first end of the array.

Figure 9:
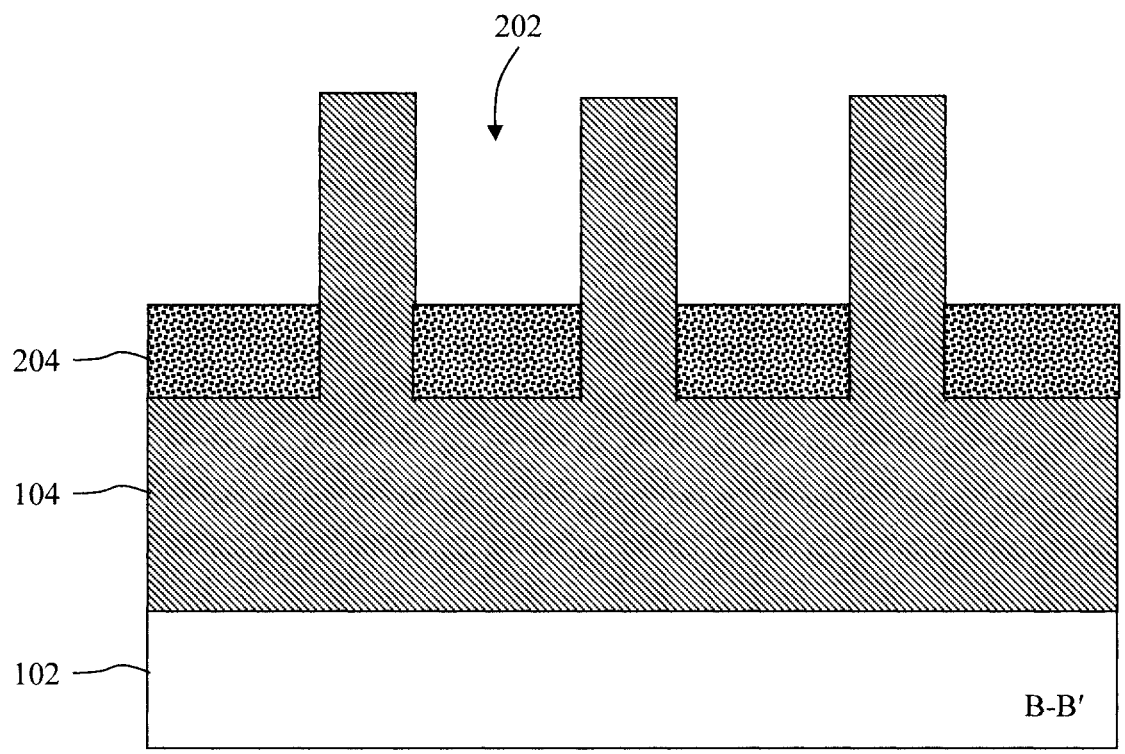
FIG. 9 is a cross-sectional diagram through the first end of the array illustrating the first ILD and the sidewall spacers having been removed from the first end of the array according to an embodiment of the present invention.

The first ILD 502 and sidewall spacers 302 are then removed from the first end of the array. See FIG. 9. FIG. 9 provides a cross-sectional view of the device through the first end of the array (see view B-B' in FIG. 6). For instance, with the block mask 602 in place, a directional (anisotropic) etching process such as RIE can be used to clear the first ILD 502 from the first end of the array, exposing the sidewall spacers 302. The sidewall spacers 302 can then be removed using a non-directional (isotropic) etching process such as a wet chemical etch. The block mask 602 is then also removed. All that remains at the first end of the array are the lower level bottom electrodes 204 at the bottom of the trenches 202.

Figure 10:
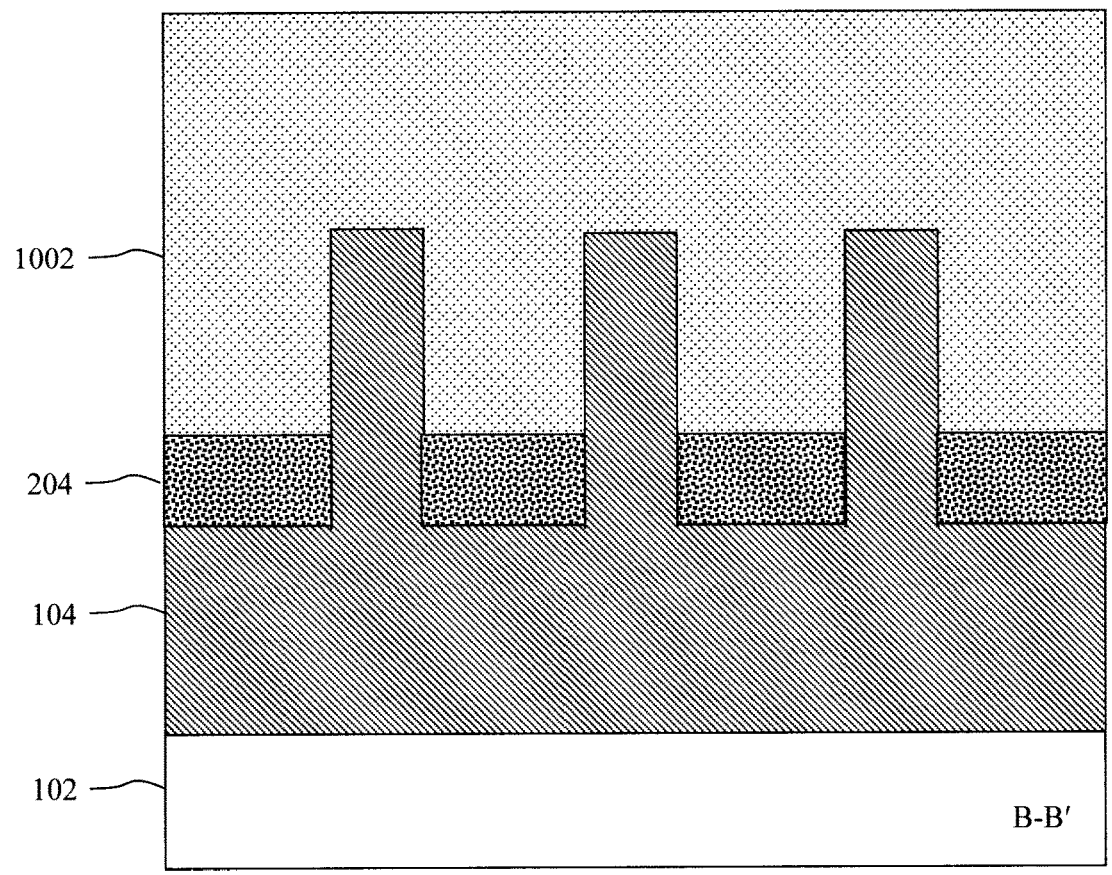
FIG. 10 is a cross-sectional diagram through the first end of the array illustrating a second ILD having been deposited on the lower level bottom electrodes at the first end of the array, and on the first ILD at a second, opposite end of the array according to an embodiment of the present invention.

A second ILD 1002 is then deposited into and filling the trenches 202 followed by CMP. See FIG. 10. FIG. 10 provides a cross-sectional view of the device through the first end of the array (see view B-B' in FIG. 6). Suitable ILDs include, but are not limited to, SiOx, silicon oxycarbide (SiOC) and/or organic planarizing layer (OPL) materials. The same or different ILD can be employed for first/second ILDs 502/1002. However, the selection of different materials for first/second ILDs 502/1002 can provide etch selectivity between the layers which can be advantageous during contact via patterning (see, e.g., FIG. 12—described below).

As shown in FIG. 10, this second ILD 1002 covers the lower level bottom electrodes 204 at the bottom of the trenches 202 at the first end of the array. Notably, as described for example in conjunction with the description of FIG. 5, above, the first ILD 502 was recessed to expose the higher level bottom electrodes 206. Thus, at the second end of the array (i.e., opposite the first end) the second ILD 1002 is disposed on the first ILD 502 (see, e.g., FIG. 12—described below).

Figure 11:
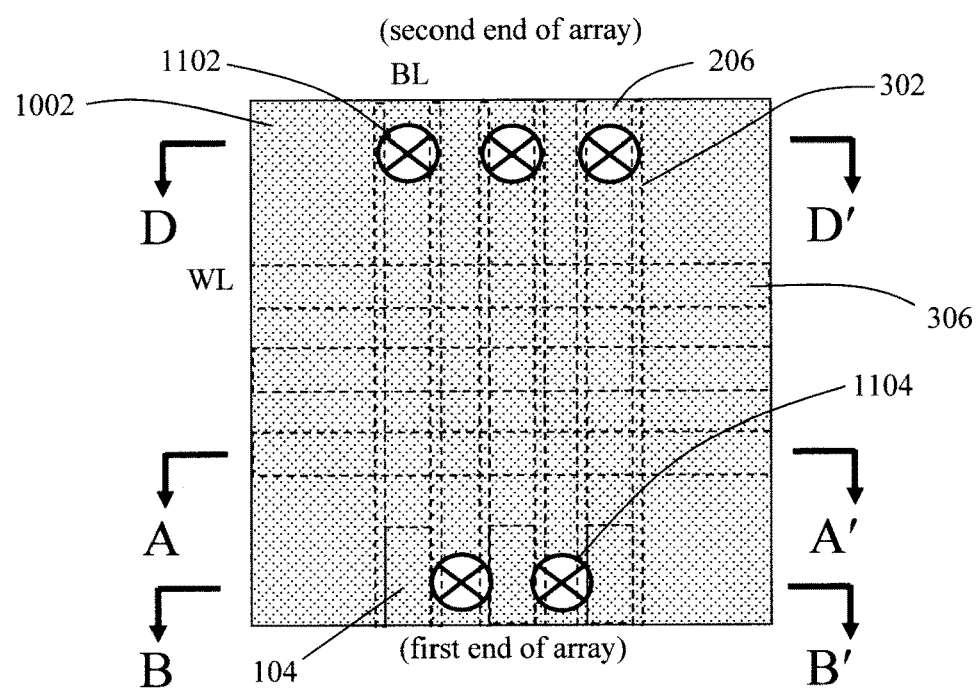
FIG. 11 is a top-down diagram illustrating contact vias having been patterned to the higher level bottom electrodes and lower level bottom electrodes according to an embodiment of the present invention.

As shown in FIG. 11, contact vias 1102 and 1104 are then patterned to the higher level bottom electrodes 206 and lower level bottom electrodes 204, respectively. FIG. 11 is a top-down view of the array of RRAM cells. As shown in FIG. 11, contact vias 1102 and 1104 are formed at the opposite (first/second) ends of the array. Thus, two sets of contacts will be formed, one set at the first end of the array to contact the lower level bottom electrodes 204, and the other set at the second end of the array to contact the higher level bottom electrodes 206.

Figure 12:
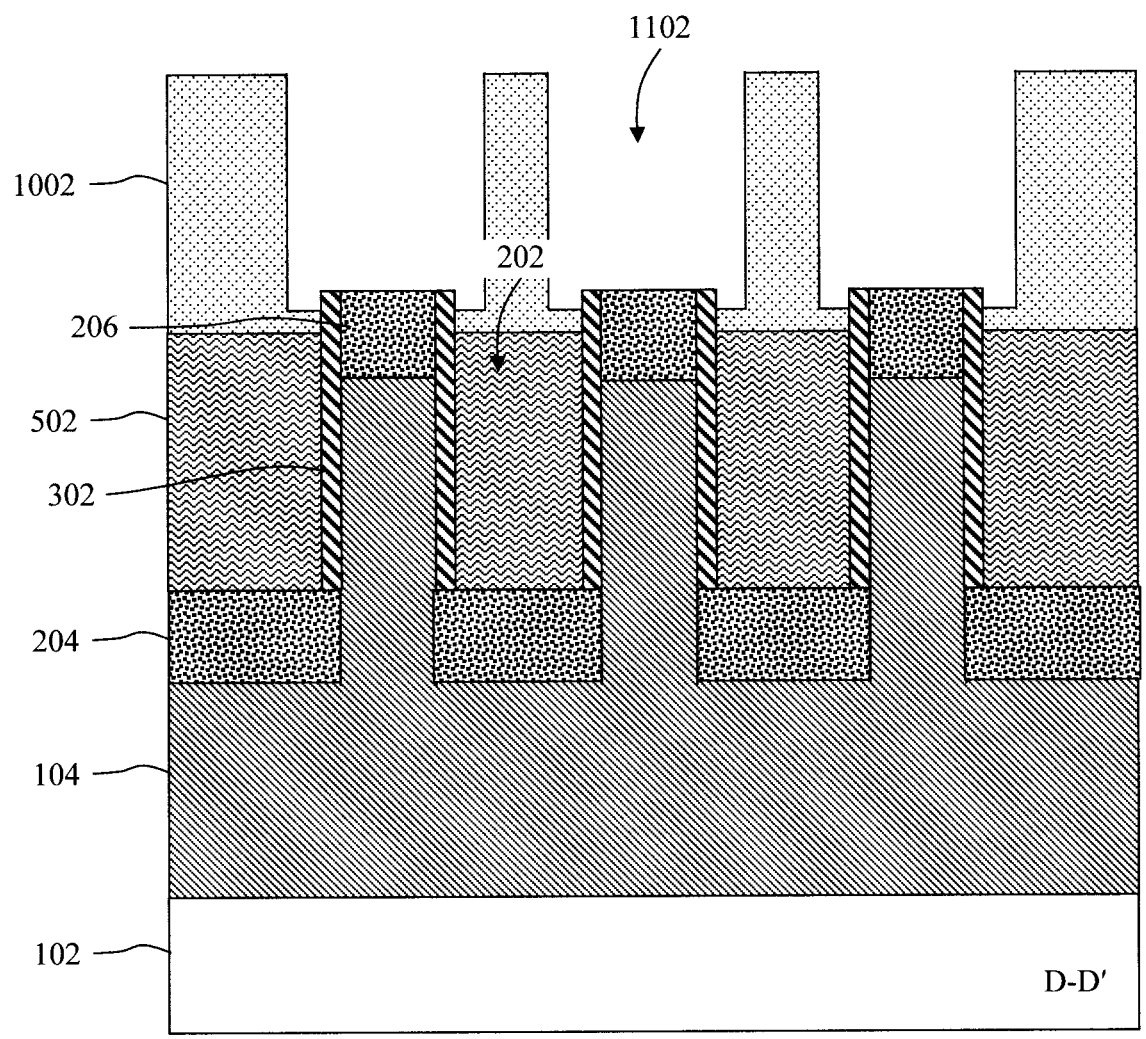
FIG. 12 is a cross-sectional diagram through the second end of the array illustrating the contact vias having been patterned to the higher level bottom electrodes according to an embodiment of the present invention.

A cross-sectional view of the contact vias 1102 patterned to the higher level bottom electrodes 206 at the second end of the array is provided in FIG. 12 (see view D-D' in FIG. 11). As shown in FIG. 12, the second ILD 1002 is disposed on the first ILD 502 at the second end of the array. Contact vias 1102 are patterned in the second ILD 1002 over each of the higher level bottom electrodes 206. A directional (anisotropic) etching process such as RIE can be employed for the contact via patterning. According to an exemplary embodiment, the contact vias 1102 extend partway through the second ILD 1002 with the tops of the higher level bottom electrodes 206 and sidewall spacers 302 exposed at the bottoms of the contact vias 1102.

As noted above, this contact via etch is self-aligned. Namely, referencing FIG. 12 and FIG. 13 (see below), the contact etch is self-aligned due the etch selectivity of the second ILD 1002 relative to the first ILD 502. As such, the later filled metal (see below) will contact the lower/higher level bottom electrodes 204/206.

Figure 13:
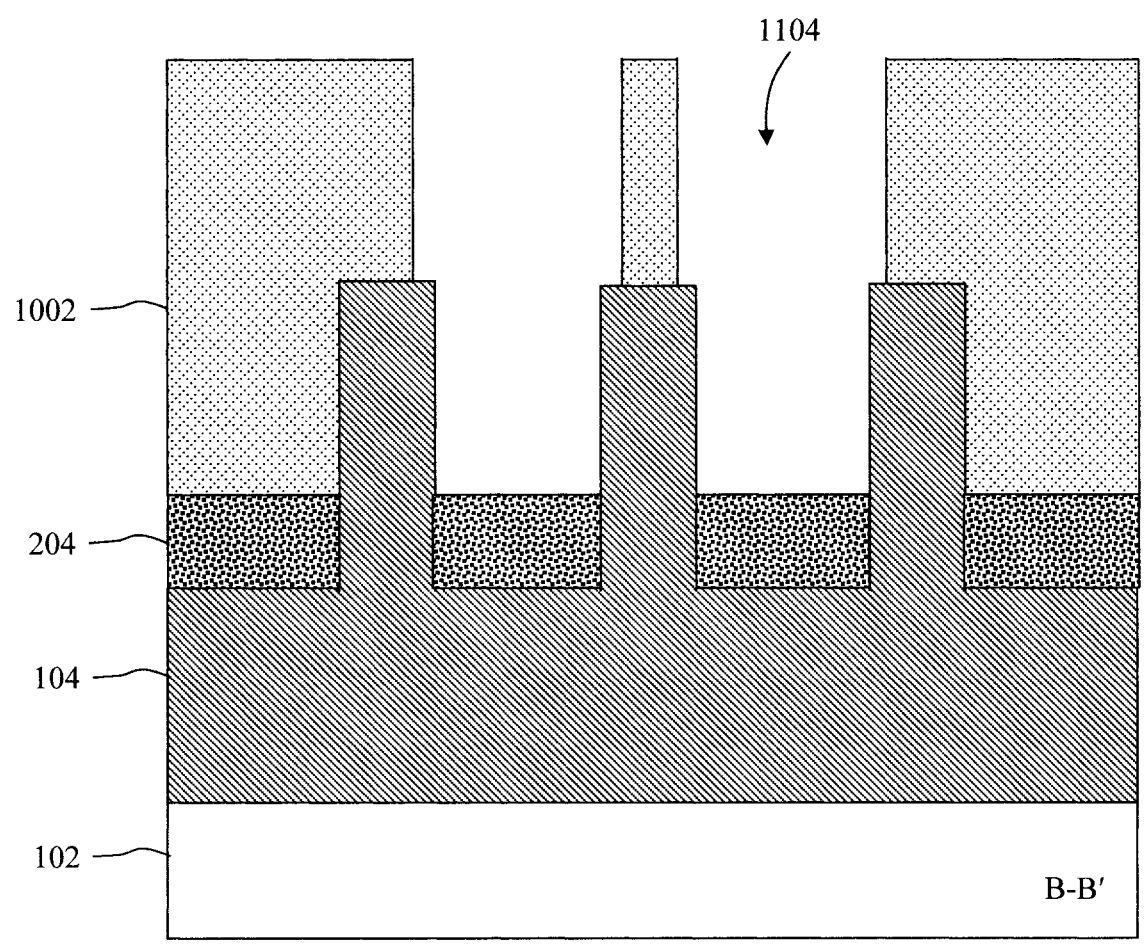
FIG. 13 is a cross-sectional diagram through the first end of the array illustrating the contact vias having been patterned to the lower level bottom electrodes according to an embodiment of the present invention.

A cross-sectional view of the contact vias 1104 patterned to the lower level bottom electrodes 204 at the first end of the array is provided in FIG. 13 (see view B-B' in FIG. 11). As shown in FIG. 13, the second ILD 1002 is disposed directly on the lower level bottom electrodes 204 at the first end of the array. Contact vias 1104 are patterned in the second ILD 1002 over each of the lower level bottom electrodes 204. As above, a self-aligned directional (anisotropic) etching process such as RIE can be employed for the contact via patterning. As shown in FIG. 13, the lower level bottom electrodes 204 are exposed at the bottoms of the contact vias 1104.

Figure 14:
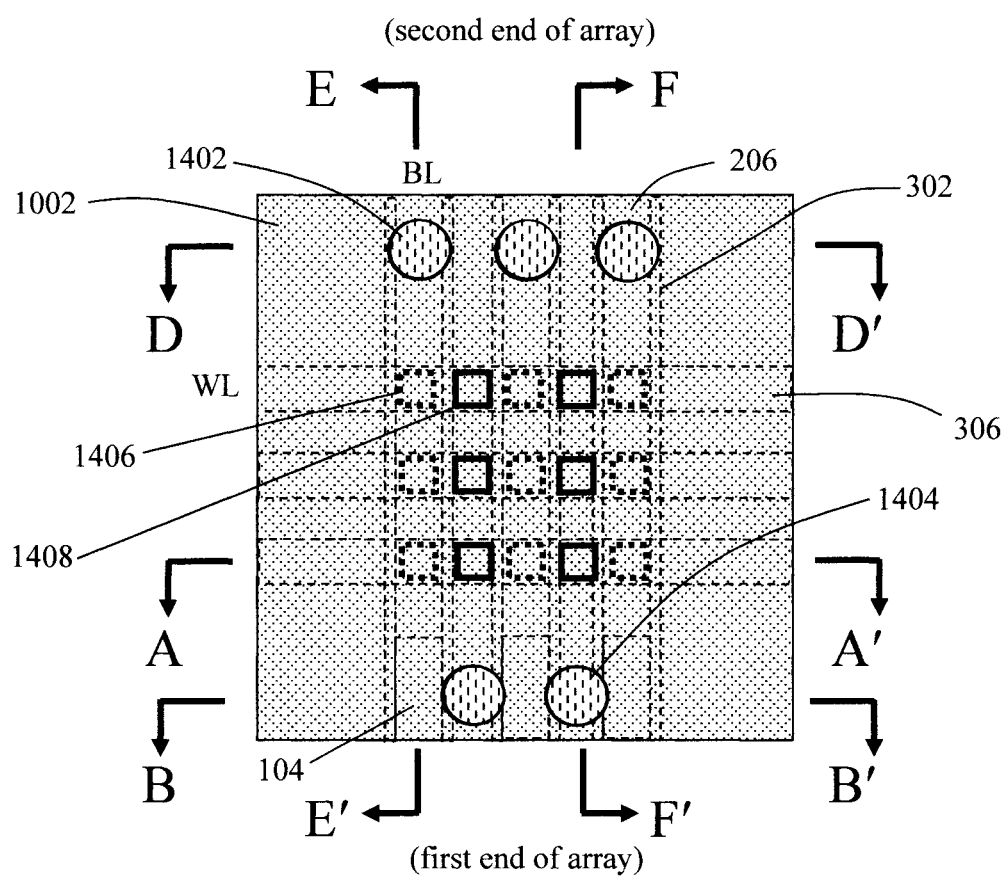
FIG. 14 is a top-down diagram illustrating an electrically conductive material(s) having been deposited into the contact vias, forming contacts according to an embodiment of the present invention.

An electrically conductive material(s) is then deposited into the contact vias 1102 and 1104 followed by CMP, forming contacts 1402 and 1404, respectively. See FIG. 14. FIG. 14 is a top-down view of the array of RRAM cells. Suitable conductive materials include, but are not limited to, contact metals such as titanium (Ti), tantalum (Ta), tungsten (W), molybdenum (Mo), platinum (Pt), hafnium (Hf), copper (Cu), aluminum (Al), gold (Au), nickel (Ni) and/or iridium (Ir). The contact metal(s) for contacts 1402 and 1404 can be deposited using a process such as CVD, ALD, PVD, sputtering, evaporation, and electrochemical plating.

As shown in FIG. 14, contacts 1402 and 1404 are formed at the opposite (first/second) ends of the array. Thus, two sets of contacts are formed, one set (contacts 1404) at the first end of the array to contact the lower level bottom electrodes 204, and the other set (contacts 1402) at the second end of the array to contact the higher level bottom electrodes 206.

Figure 15:
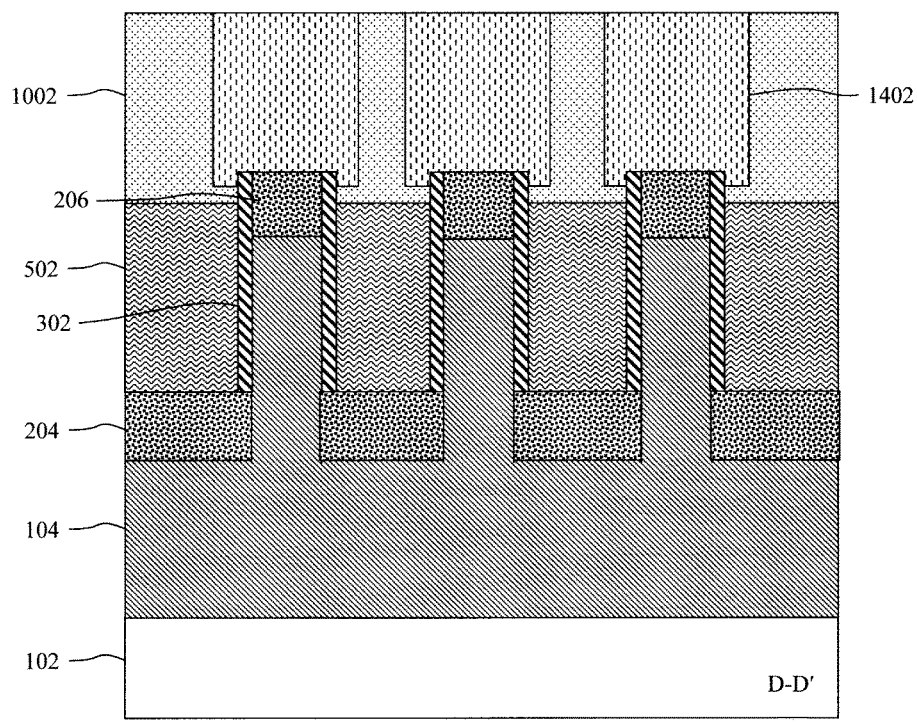
FIG. 15 is a cross-sectional diagram through the second end of the array illustrating the contacts having been formed to the higher level bottom electrodes according to an embodiment of the present invention.

A cross-sectional view of the contacts 1402 formed to the higher level bottom electrodes 206 at the second end of the array is provided in FIG. 15 (see view D-D' in FIG. 14). As shown in FIG. 15, the contacts 1402 are in direct contact with the tops of the higher level bottom electrodes 206 at the bottoms of the contact vias 1102.

Figure 16:
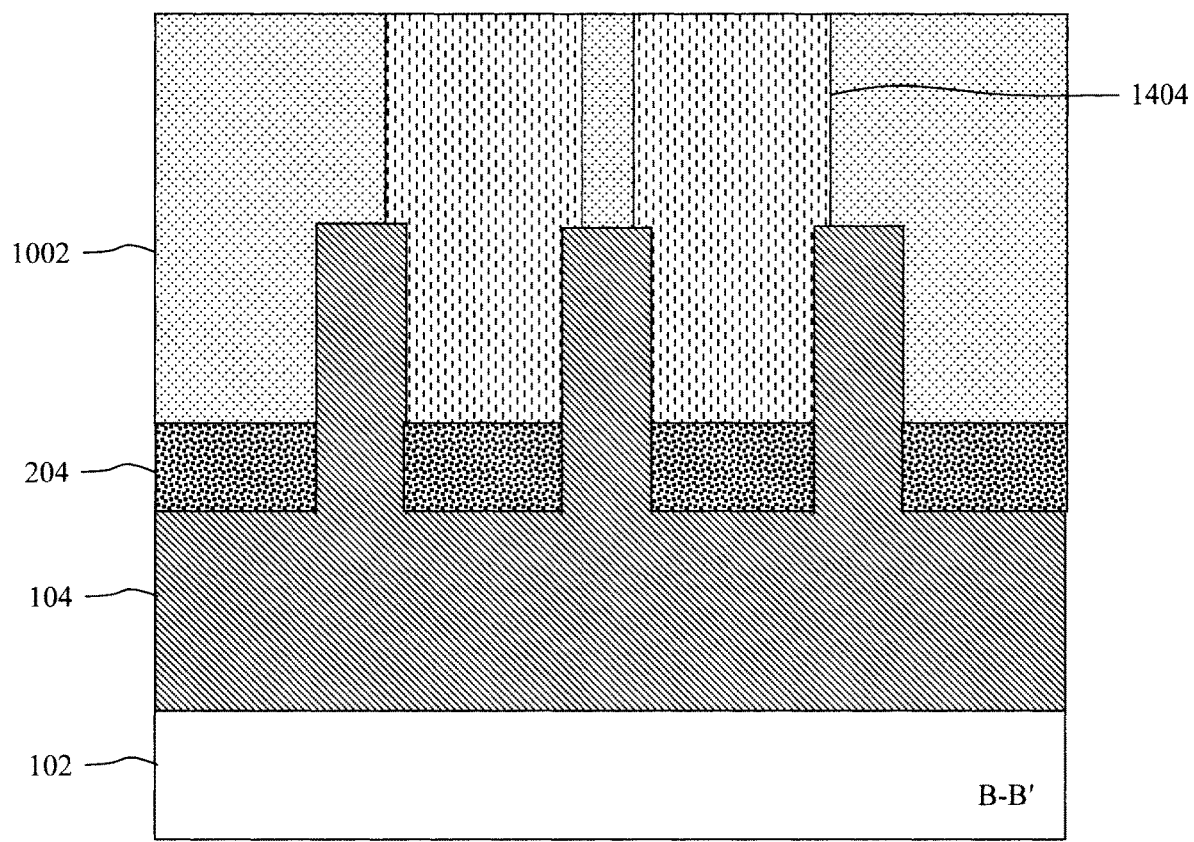
FIG. 16 is a cross-sectional diagram through the first end of the array illustrating the contacts having been formed to the lower level bottom electrodes according to an embodiment of the present invention.

A cross-sectional view of the contacts 1404 formed to the lower level bottom electrodes 204 at the first end of the array is provided in FIG. 16 (see view B-B' in FIG. 14). As shown in FIG. 16, the contacts 1404 are in direct contact with the lower level bottom electrodes 204 at the bottoms of the contact vias 1104.

Figure 17:
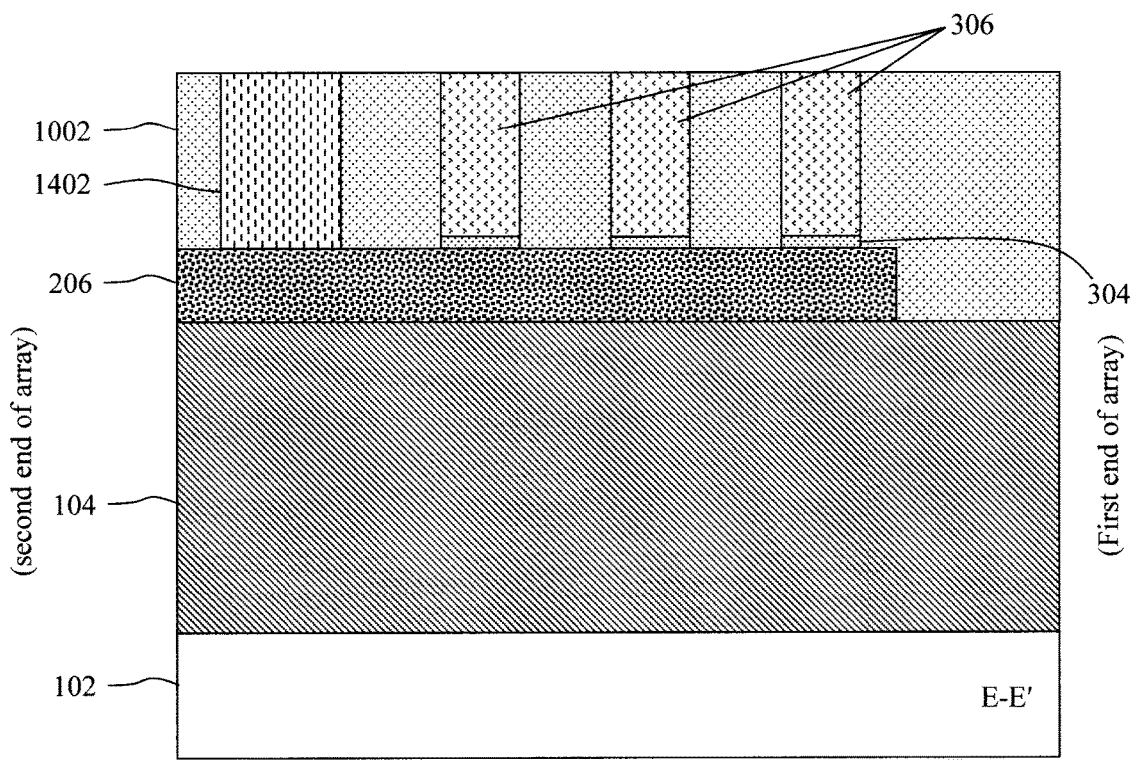
FIG. 17 is a cross-sectional diagram through the first end of the array, parallel to/through one of the higher level bottom electrodes, and perpendicular to the top electrodes illustrating the contacts having been formed to the higher level bottom electrodes according to an embodiment of the present invention.

Another cross-sectional view of the contacts 1402 formed to the higher level bottom electrodes 206 at the first end of the array is provided in FIG. 17 (see view E-E' in FIG. 14). In this particular depiction, the cross-sectional view is parallel to/through one of the higher level bottom electrodes 206, and perpendicular to the top electrodes 306.

As shown in FIG. 17, the contacts 1402 to the higher level bottom electrodes 206 are present in the second ILD 1002 at the second end of the array. The top electrodes 306 are separated from the higher level bottom electrodes 206 by the insulating layer 304 forming the present RRAM cells. Namely, as provided above, each RRAM cell includes one of the bottom electrodes 204 or 206 separated from one of the top electrodes 306 by the insulating layer 304. For instance, referring briefly back to FIG. 14, each box 1406 and 1408 represents one RRAM cell, wherein the RRAM cell 1406 is between a higher level bottom electrode 206 and a top electrode 306, and the RRAM cell 1408 is between a lower level bottom electrode 204 and a top electrode 306.

Figure 18:
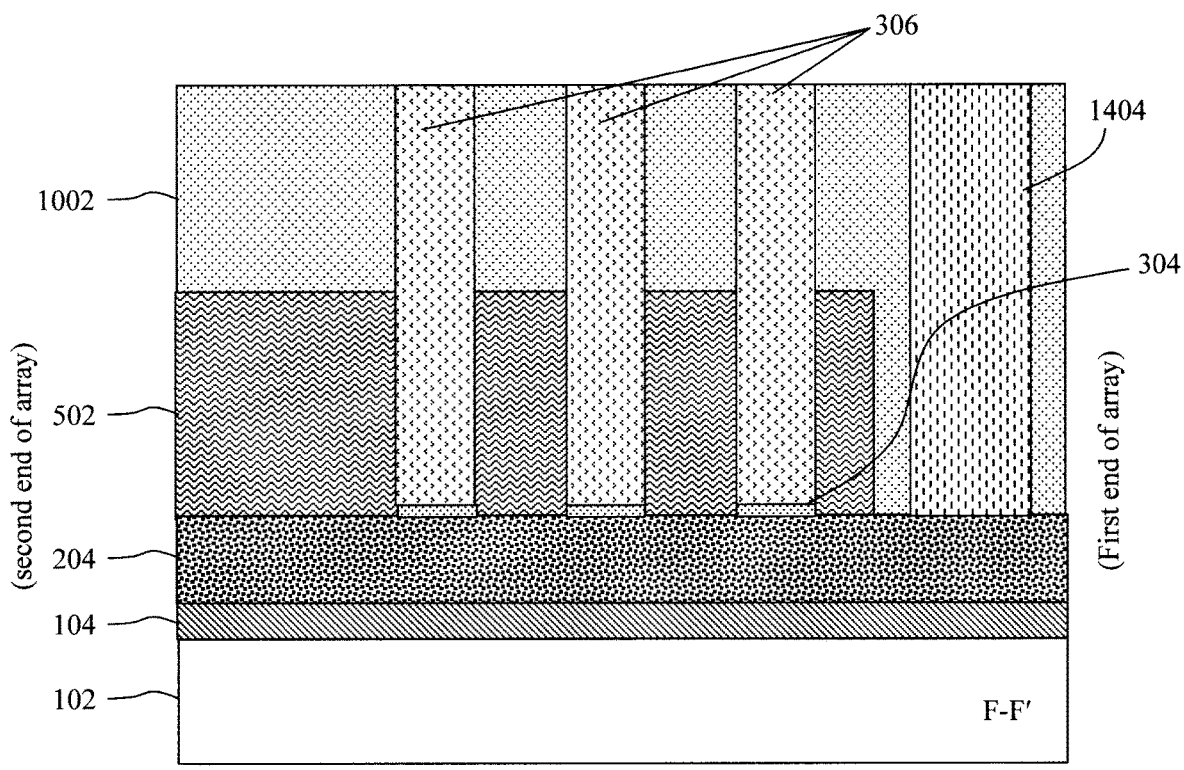
FIG. 18 is a cross-sectional diagram through the first end of the array, parallel to/through one of the lower level bottom electrodes, and perpendicular to the top electrodes illustrating the contacts having been formed to the lower level bottom electrodes according to an embodiment of the present invention.

Another cross-sectional view of the contacts 1404 formed to the lower level bottom electrodes 204 at the first end of the array is provided in FIG. 18 (see view F-F' in FIG. 14). In this particular depiction, the cross-sectional view is parallel to/through one of the lower level bottom electrodes 204, and perpendicular to the top electrodes 306.

As shown in FIG. 18, the contacts 1404 to the lower level bottom electrodes 204 are present in the second ILD 1002 at the first end of the array. The top electrodes 306 are separated from the lower level bottom electrodes 204 by the insulating layer 304 forming the present RRAM cells. Namely, as provided above, each RRAM cell includes one of the bottom electrodes 204 or 206 separated from one of the top electrodes 306 by the insulating layer 304.

Figure 19:
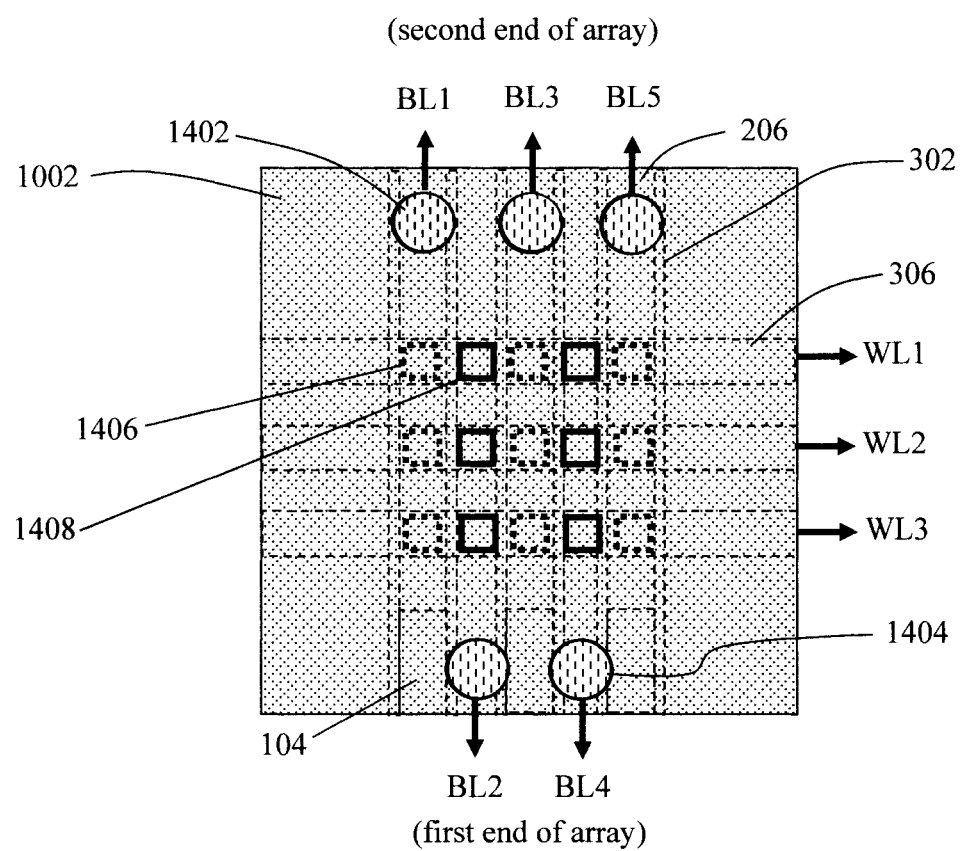
FIG. 19 is a top-down diagram illustrating how the cell density is increased by the present design according to an embodiment of the present invention.

FIG. 19, a top-down view of the array of RRAM cells, illustrates how the cell density is increased by the present design. Namely, as shown in FIG. 19, the bottom electrodes 204 and 206 form a plurality of BLs, i.e., BL1-BL5, and the top electrodes 306 form a plurality of WLs, i.e., WL1-WL3. Contacts 1404 to the BLs (i.e., BL2 and BL4) formed by the lower level bottom electrodes 204 are present at the first end of the array. Contacts 1402 to the BLs (i.e., BKL1, BL3, and BL5) formed by the higher level bottom electrodes 206 are present at the second, opposite, end of the array. With conventional layouts, cells would at most be formed at the intersection of the BL1, BL3, BL5 and the WL1, WL2, WL3. See boxes 1406. However, with the present techniques, by offsetting the bottom electrodes 204 and 206 at different levels, RRAM cells are also formed at the intersection of the BL2, BL4 and the WL1, WL2, WL3. See boxes 1408. Thus, the cell density is increased by about 100% as compared to a conventional cell layout.

Figure 20:
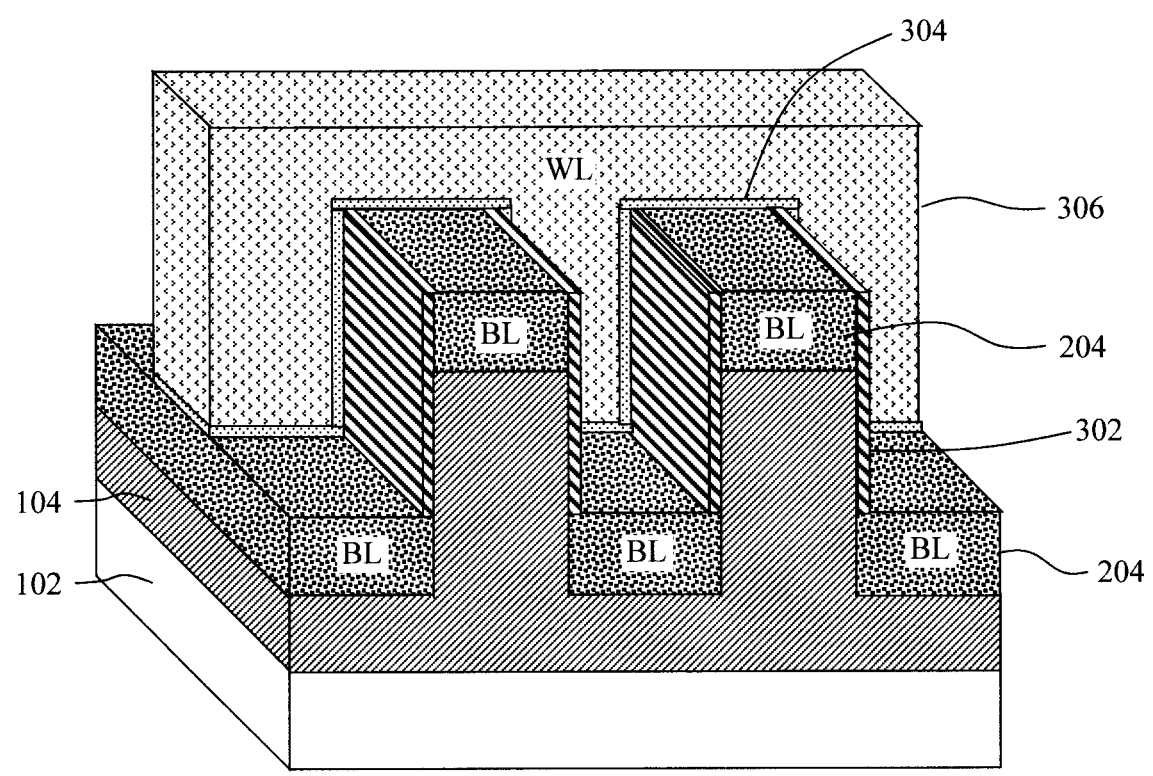
FIG. 20 is a three-dimensional diagram the present resistive random access memory (RRAM) device design according to an embodiment of the present invention.

FIG. 20 provides a three-dimensional illustration of the present RRAM device design. As shown in FIG. 20, the bottom electrodes 204 and 206 form a plurality of BLs and the top electrodes form a plurality of WLs that are orthogonal to the BLs. Each RRAM cell includes one of the bottom electrodes 204 and 206 separated from one of the top electrodes 306 by the insulating layer 304.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A resistive random access memory (RRAM) device, comprising:
   a substrate;
   an underlayer disposed on the substrate;
   trenches patterned in the underlayer;
   bottom electrodes disposed at two different levels of the underlayer whereby the bottom electrodes comprise first bottom electrodes at bottoms of the trenches and second bottom electrodes along a top surface of the underlayer in between the trenches;
   an insulating layer disposed on the first and second bottom electrodes; and
   top electrodes disposed on the insulating layer over the first and second bottom electrodes, wherein the top electrodes comprise word lines, wherein the first and second bottom electrodes comprise bit lines that are orthogonal to the word lines, and wherein the first and second bottom electrodes, the insulating layer, and the top electrodes form the RRAM device having an array of cells, each cell comprising one of the first or second bottom electrodes separated from one of the top electrodes by the insulating layer.

2. The RRAM device of claim 1, wherein the underlayer comprises a material selected from the group consisting of: silicon oxide (SiOx) and porous organosilicate glass (pSiCOH).

3. The RRAM device of claim 1, further comprising:
   sidewall spacers lining sidewalls of the trenches.

4. The RRAM device of claim 3, wherein the sidewall spacers comprise a material selected from the group consisting of: silicon nitride (SiN), silicon oxycarbonitride (SiOCN), and combinations thereof.

5. The RRAM device of claim 1, wherein the insulating layer comprises a high-κ dielectric or transition metal oxide.

6. The RRAM device of claim 1, wherein the insulating layer comprises a material selected from the group consisting of: nickel oxide (NiO$_x$), tantalum oxide (Ta$_y$O$_x$), titanium oxide (TiO$_x$), hafnium oxide (HfO$_x$), tungsten oxide (WO$_x$), zirconium oxide (ZrO$_x$), aluminum oxide (Al$_y$O$_x$), strontium titanate (SrTiO$_x$), and combinations thereof.

7. The RRAM device of claim 1, wherein the bottom electrodes comprise a material selected from the group consisting of: titanium (Ti), tungsten (W), titanium nitride (TiN), tantalum nitride (TaN), titanium aluminum nitride (TiAlN), tungsten nitride (WN), a metal-semiconductor compound, a metal silicide, and combinations thereof.

8. The RRAM device of claim 1, wherein the bottom electrodes comprise a metal silicide selected from the group consisting of: nickel silicide (Ni$_2$Si), cobalt silicide (CoSi), tungsten silicide (WSi$_2$), titanium silicide (TiSi$_2$), tantalum silicide (TaSi$_2$), platinum silicide (PtSi), erbium silicide (ErSi$_2$), and combinations thereof.

9. The RRAM device of claim 1, wherein the top electrodes comprise a material selected from the group consisting of: TiN, TaN, WN, titanium aluminide (TiAl), titanium aluminum carbide (TiAlC), tantalum aluminide (TaAl), tantalum aluminum carbide (TaAlC), Ti, Ta, tungsten (W), molybdenum (Mo), platinum (Pt), hafnium (Hf), copper (Cu), aluminum (Al), gold (Au), nickel (Ni), iridium (Ir), and combinations thereof.

10. The RRAM device of claim 1, further comprising:
contacts to the first and second bottom electrodes.

11. The RRAM device of claim 10, wherein the contacts to the first bottom electrodes are formed at a first end of the array, and wherein the contacts to the second bottom electrodes are formed at a second end of the array that is opposite to the first end of the array.

12. The RRAM device of claim 10, wherein the contacts comprise a contact metal selected from the group consisting of: titanium (Ti), tantalum (Ta), tungsten (W), molybdenum (Mo), platinum (Pt), hafnium (Hf), copper (Cu), aluminum (Al), gold (Au), nickel (Ni), iridium (Ir), and combinations thereof.

13. An RRAM device, comprising:
a substrate;
an underlayer disposed on the substrate;
trenches patterned in the underlayer;
bottom electrodes disposed at two different levels of the underlayer whereby the bottom electrodes comprise first bottom electrodes at bottoms of the trenches and second bottom electrodes along a top surface of the underlayer in between the trenches;
an insulating layer disposed on the first and second bottom electrodes;
top electrodes disposed on the insulating layer over the first and second bottom electrodes, wherein the top electrodes comprise word lines, wherein the first and second bottom electrodes comprise bit lines that are orthogonal to the word lines, and wherein the first and second bottom electrodes, the insulating layer, and the top electrodes form the RRAM device having an array of cells, each cell comprising one of the first or second bottom electrodes separated from one of the top electrodes by the insulating layer; and
contacts to the first and second bottom electrodes, wherein the contacts to the first bottom electrodes are formed at a first end of the array, and wherein the contacts to the second bottom electrodes are formed at a second end of the array that is opposite to the first end of the array.

14. The RRAM device of claim 13, wherein the underlayer comprises a material selected from the group consisting of: silicon oxide (SiOx) and porous organosilicate glass (pSiCOH).

15. The RRAM device of claim 13, wherein the insulating layer comprises a high-κ dielectric or transition metal oxide.

16. The RRAM device of claim 13, wherein the insulating layer comprises a material selected from the group consisting of: nickel oxide (NiO$_x$), tantalum oxide (Ta$_y$O$_x$), titanium oxide (TiO$_x$), hafnium oxide (HfO$_x$), tungsten oxide (WO$_x$), zirconium oxide (ZrO$_x$), aluminum oxide (Al$_y$O$_x$), strontium titanate (SrTiO$_x$), and combinations thereof.

17. The RRAM device of claim 13, wherein the bottom electrodes comprise a material selected from the group consisting of: titanium (Ti), tungsten (W), titanium nitride (TiN), tantalum nitride (TaN), titanium aluminum nitride (TiAlN), tungsten nitride (WN), a metal-semiconductor compound, a metal silicide, and combinations thereof.

18. The RRAM device of claim 13, wherein the bottom electrodes comprise a metal silicide selected from the group consisting of: nickel silicide (Ni$_2$Si), cobalt silicide (CoSi), tungsten silicide (WSi$_2$), titanium silicide (TiSi$_2$), tantalum silicide (TaSi$_2$), platinum silicide (PtSi), erbium silicide (ErSi$_2$), and combinations thereof.

19. The RRAM device of claim 13, wherein the top electrodes comprise a material selected from the group consisting of: TiN, TaN, WN, titanium aluminide (TiAl), titanium aluminum carbide (TiAlC), tantalum aluminide (TaAl), tantalum aluminum carbide (TaAlC), Ti, Ta, tungsten (W), molybdenum (Mo), platinum (Pt), hafnium (Hf), copper (Cu), aluminum (Al), gold (Au), nickel (Ni), iridium (Ir), and combinations thereof.

20. The RRAM device of claim 13, wherein the contacts comprise a contact metal selected from the group consisting of: titanium (Ti), tantalum (Ta), tungsten (W), molybdenum (Mo), platinum (Pt), hafnium (Hf), copper (Cu), aluminum (Al), gold (Au), nickel (Ni), iridium (Ir), and combinations thereof.

* * * * *